(12) United States Patent
Rajendran et al.

(10) Patent No.: US 9,722,546 B2
(45) Date of Patent: Aug. 1, 2017

(54) BIAS CIRCUIT FOR LOW QUIESCENT CURRENT AMPLIFIER

(71) Applicant: Avago Technologies General IP (Singapore) Pte. Ltd., Singapore (SG)

(72) Inventors: Jagadheswaran Rajendran, Penang (MY); Yut Hoong Chow, Penang (MY)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/812,349

(22) Filed: Jul. 29, 2015

(65) Prior Publication Data
US 2017/0033748 A1 Feb. 2, 2017

(51) Int. Cl.
H03F 3/04 (2006.01)
H03F 1/02 (2006.01)
H03F 3/19 (2006.01)
H03F 3/21 (2006.01)
H03F 1/30 (2006.01)
H03F 3/191 (2006.01)
H03F 3/24 (2006.01)

(52) U.S. Cl.
CPC .......... *H03F 1/0288* (2013.01); *H03F 1/302* (2013.01); *H03F 3/19* (2013.01); *H03F 3/191* (2013.01); *H03F 3/211* (2013.01); *H03F 3/245* (2013.01); *H03F 2200/451* (2013.01); *H03F 2203/21106* (2013.01)

(58) Field of Classification Search
CPC .......... H03F 1/0288; H03F 3/19; H03F 3/211; H03F 2200/451; H03F 2203/21106
USPC ....... 330/127, 130, 134, 259, 261, 285, 288, 330/296; 327/530, 535, 538, 540
See application file for complete search history.

(56) References Cited

U.S. PATENT DOCUMENTS

| | | | |
|---|---|---|---|
| 8,854,143 B2 | 10/2014 | Bouny | |
| 2008/0297260 A1* | 12/2008 | Makihara | H03F 1/52 330/298 |
| 2016/0094189 A1* | 3/2016 | Lyalin | H03F 3/211 330/296 |

FOREIGN PATENT DOCUMENTS

JP 2011-109387 A 6/2011

OTHER PUBLICATIONS

Machine Translation of JP2011109387A.

* cited by examiner

*Primary Examiner* — Steven J Mottola
*Assistant Examiner* — Hafizur Rahman

(57) ABSTRACT

A bias circuit for applying bias current to a low quiescent current amplifier includes first and second transistors and a transistor pair circuit. The first transistor is connected to a supply bias voltage source and an auxiliary bias voltage source, and is controlled by a bias voltage output from the auxiliary bias voltage source, the first transistor acting as a current source. The second transistor is connected to the supply bias voltage source and an output of the first transistor, and is controlled by the output of the first transistor to selectively buffer supply bias current from the supply bias voltage source provided to the low quiescent current amplifier via a bias resistor. The transistor pair circuit includes third and fourth transistors connected in series, one of the third and fourth transistors is also connected in parallel with a dividing resistor, the transistor pair circuit acting as a voltage source.

20 Claims, 8 Drawing Sheets

BIAS CIRCUIT FOR LOW QUIESCENT CURRENT AMPLIFIER

BACKGROUND

Various electronic devices, particularly those used for radio frequency (RF) wireless communications, typically include amplifiers for amplifying input signals at one or more stages. Some amplifiers, such as Doherty amplifiers, include one or more low quiescent current amplifiers that must be biased to very low currents, such as Class-B mode or Class-C mode amplifiers, as well as amplifiers that must be biased to relatively high currents, such as Class-A mode or Class-AB mode amplifiers. However, conventional bias circuits may become unstable when providing bias currents to particularly low current amplifiers, disrupting amplifier operation.

FIG. 1 is a circuit diagram illustrating a conventional bias circuit for providing bias current to an amplifier.

Referring to FIG. 1, a bias circuit 100 is configured to apply a bias current to a representative low quiescent current amplifier, indicated by transistor 140, such as a Class-B mode or Class-C mode amplifier. As mentioned above, an example of an electronic device having a low quiescent current amplifier is a Doherty amplifier, an example of which is shown in FIG. 2, discussed below.

The bias circuit 100 includes a first resistance 115, a first transistor 120 and a transistor pair 130. The first resistance 115 is connected between an auxiliary bias voltage source (Vaux) and a first node 111, which is also connected to a base of the first transistor 120. The transistor pair 130 includes a second transistor 133 and a third transistor 134 connected in series between the first node 111 and ground. The bias circuit 100 also includes a capacitor 122 connected between the first node 111 and ground.

The first transistor 120 is connected between a supply bias voltage source (Vbias) and a base of the transistor 140 in the low quiescent current amplifier via a second resistance 125. The first transistor 120, the second resistance 125 and the capacitor 122 are thus configured to buffer current supplied to the base of the transistor 140, such that the bias circuit 100 attempts to bias the transistor 140 to a very low quiescent current level. The low quiescent current amplifier also includes an input port 144 (RF IN) connected to the base of the transistor 140, an output port 145 (RF OUT) connected to a collector of the transistor 140, which is also connected to a supply voltage source (Vcc) via a DC feed 147. An emitter of the transistor 140 is connected to ground.

In operation, the first resistance 115 provides the bias current for the second transistor 133 and the third transistor 134 of the transistor pair 130. A reference voltage is generated at the base of the first transistor 120, and is buffered by the first transistor 120 to bias the transistor 140 in the low quiescent current amplifier via the second resistance 125. This topology has two inter-related drawbacks. First, in order to bias the transistor 140 to very low currents (in Class-B mode and Class-C mode) the first resistance 115 must be very large, typically tens or hundreds of kOhms, which is impractical for integration and/or very costly to implement. Second, even with a very large resistance 115, the maximum current into the base of the first transistor 120 and the transistor pair 130 is limited. When the (RF) input signal at the input port 144 is large, the transistor 140 draws significant base current. The first transistor 120 supplies this current by buffering the bias current through the first resistance 115 flowing into its base. However, an increase in current through the first resistance 115 reduces voltage at the base of both the first transistor 120 and the transistor 140. As the input signal continues to increase, there comes a point at which the voltage drops so much that the base current into the transistor 140 cannot be sustained, and thus the output power from the transistor 140 saturates. Accordingly, there is a need for a bias circuit capable of biasing low quiescent current amplifiers to very low current levels (e.g., Class-B mode and Class-C mode).

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

According to various embodiments, a bias circuit for applying a bias current to a low quiescent current amplifier includes a first transistor, a second transistor and a transistor pair circuit. The first transistor is connected to a supply bias voltage source (Vbias) and an auxiliary bias voltage source (Vaux), operation of the first transistor being controlled by an auxiliary bias voltage output from the auxiliary bias voltage source (Vaux), where the first transistor acts as a current source. The second transistor is connected to the supply bias voltage source (Vbias) and an output of the first transistor, operation of the second transistor being controlled by the output of the first transistor to selectively buffer an amount of supply bias current from the supply bias voltage source (Vbias) provided to the low quiescent current amplifier via a bias resistor. The transistor pair circuit includes a third transistor and a fourth transistor connected in series between the first transistor and ground. One of the third transistor and the fourth transistor in the transistor pair circuit is also connected in parallel with a dividing resistor. The transistor pair circuit acts as a voltage source.

Figure 4:
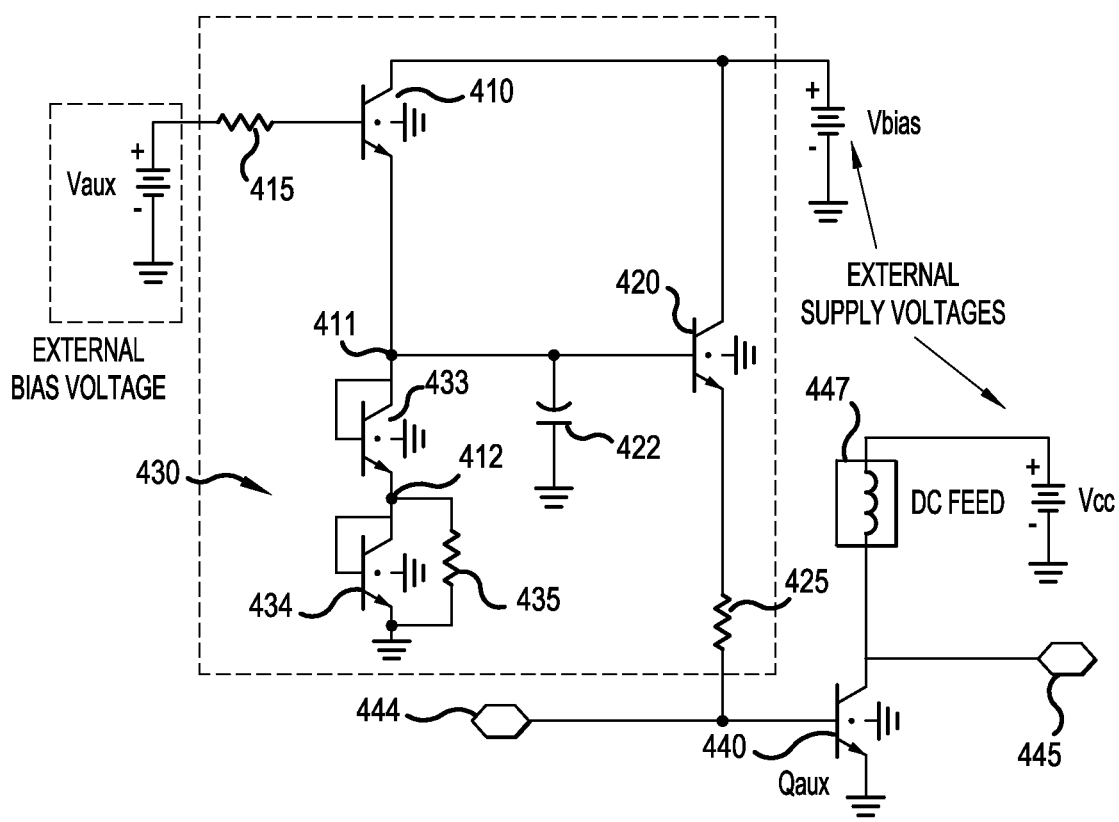
FIG. 4 is a circuit diagram illustrating a bias circuit for biasing a low quiescent current amplifier, according to a representative embodiment.
Figure 5:
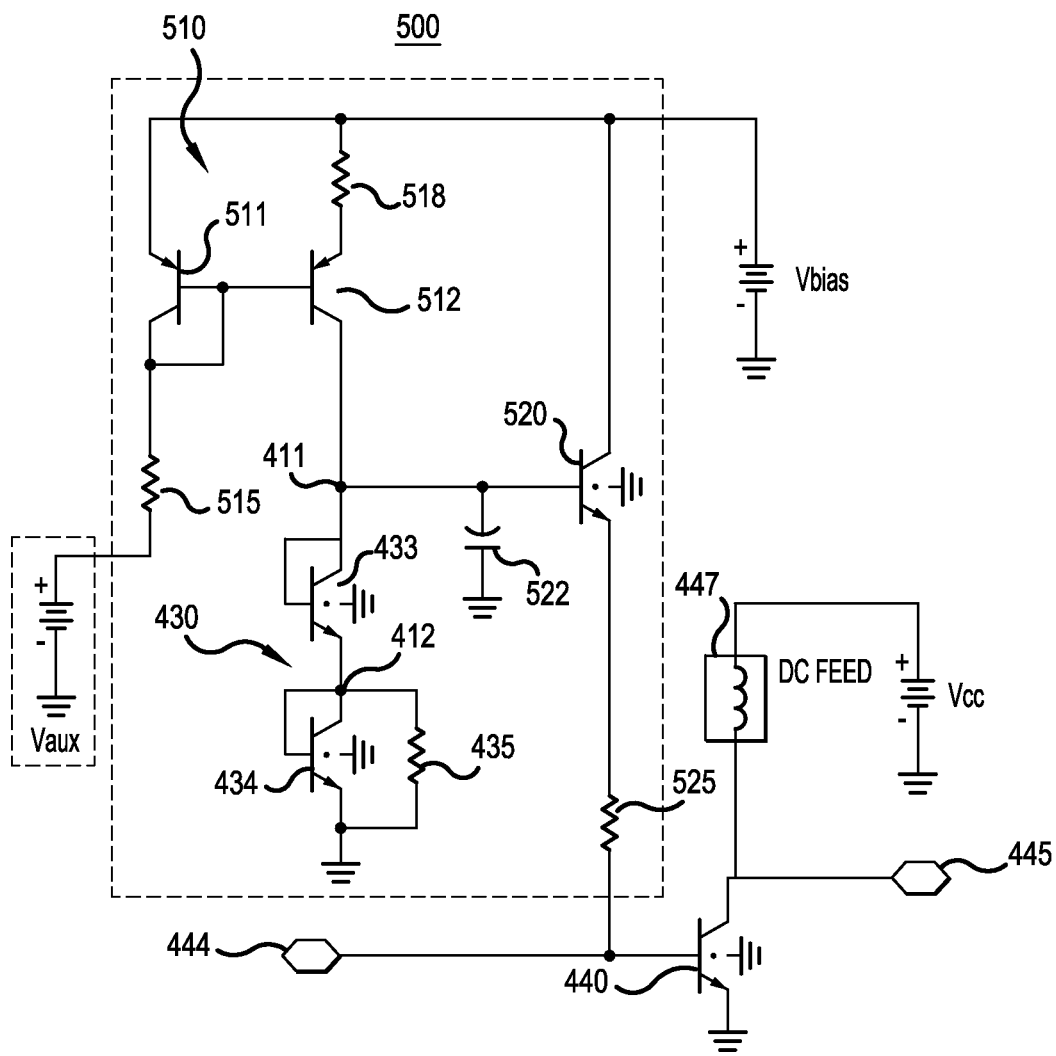
FIG. 5 is a circuit diagram illustrating a bias circuit for biasing a low quiescent current amplifier, according to a representative embodiment.

As mentioned above, various types of signal amplifiers may be used for amplifying RF wireless communication signals. One type of amplifier is a Doherty amplifier, which includes a main (or carrier) amplifier for amplifying incoming RF signals, and an auxiliary (or peaking) amplifier for provided additional amplification to supplement the main amplifier, as needed. The auxiliary amplifier is a low quiescent current amplifier that benefits from the bias circuit, according to various embodiments, examples of which are illustrated in FIGS. 4 and 5, discussed below.

Figure 2:
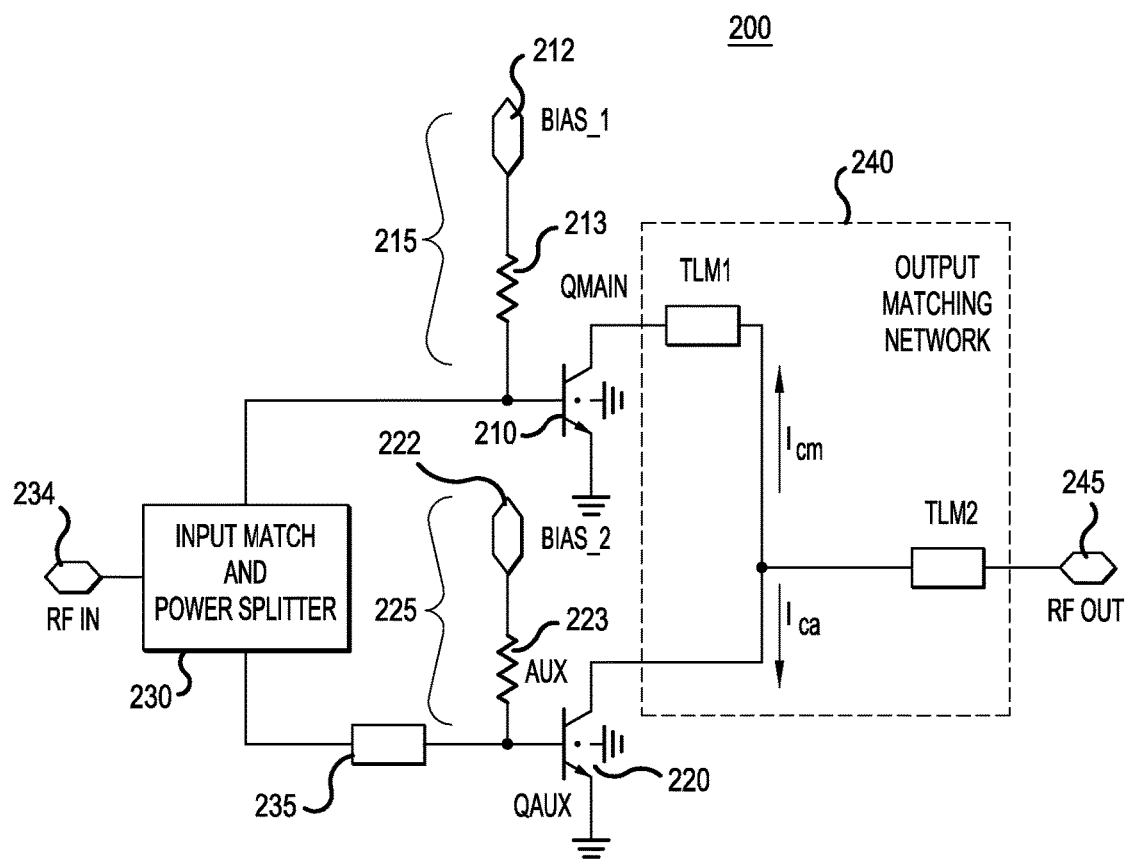
FIG. 2 is a circuit diagram of a Doherty amplifier.

FIG. 2 is a circuit diagram of a typical Doherty amplifier 200, which includes a main amplifier comprising main transistor 210, an auxiliary amplifier comprising auxiliary transistor 220, an input matching network/power splitter 230, and an output matching network 240. The main transistor 210 and the auxiliary transistor 220 are connected in parallel with one another at the output port 245, and may be implemented as bipolar junction transistors (BJTs) (also referred to as bipolar transistors). Accordingly, each of the main transistor 210 and the auxiliary transistor 220 includes a collector connected to the output matching network 240 and an emitter connected to ground.

The main transistor 210 further includes a base connected to a first bias circuit 215 (including a first resistor 213 connected to a first bias voltage 212), as well as to the input matching network/power splitter 230. The auxiliary transistor 220 further includes a base connected to a second bias circuit 225 (including a second resistor 223 connected to a second bias voltage 222), as well as to the input matching network/power splitter 230 via a delay line 235. The delay line 235 is configured to delay the input signal received at input port 234 to the auxiliary transistor 220 by 90 degrees. The output matching network 240 also serves as a combiner to add the output signals from both the main transistor 210 and the auxiliary transistor 220 in correct phase, so that the signal at output port 245 is maximized. Transmission lines (or delay lines) TLM1 and TLM2 are used for RF impedance matching.

High efficiency may be achieved by turning ON only the main transistor 210 in low power mode. As the input power increases, the combination of the delay line 235 and the output matching network 240 will turn ON the auxiliary transistor 220, so that the auxiliary transistor 220 is used only to add power to the output of the main transistor 210 after the main transistor 210 has saturated. The input power at which the auxiliary transistor turns ON depends on the relative sizes of the main transistor 210 and the auxiliary transistor 220, as would be apparent to one of ordinary skill in the art. If they are about the same size, then the auxiliary transistor 220 turns ON at about 6 dB below the maximum combined output power of both the main and auxiliary transistors 210 and 220, as depicted in FIG. 3, discussed below.

A consideration in designing the Doherty amplifier 200 is the first and second bias circuits 215 and 225 connected to pins labeled BIAS_1 and BIAS_2. The first and second bias circuits 215 and 225 are usually not the same. For example, the main transistor 210 may be biased by the first bias circuit 215 in Class-A or Class-AB mode, while auxiliary transistor 220 may be biased by the second bias circuit 225 in Class-B mode or Class-C mode. Generally, the lower the quiescent current for the auxiliary transistor 220, the higher the efficiency of the overall Doherty amplifier 200. Exemplary quiescent current values are about 10 mA to about 100 mA for current Icm, and less than about 500 uA for current Ica. Currents Icm and Ica are the total current flowing in the main transistor 210 and the auxiliary transistor 220, respectively. At very low input power levels, current Icm would be equal to the quiescent current through the main transistor 210, and current Ica would be equal to the quiescent current through the auxiliary transistor 220. Current Ica would only start to increase from the quiescent level when the auxiliary transistor 220 turns ON, i.e., about 6 B below the maximum output power in the case where the main and auxiliary transistors 210 and 220 are about the same size.

Figure 3:
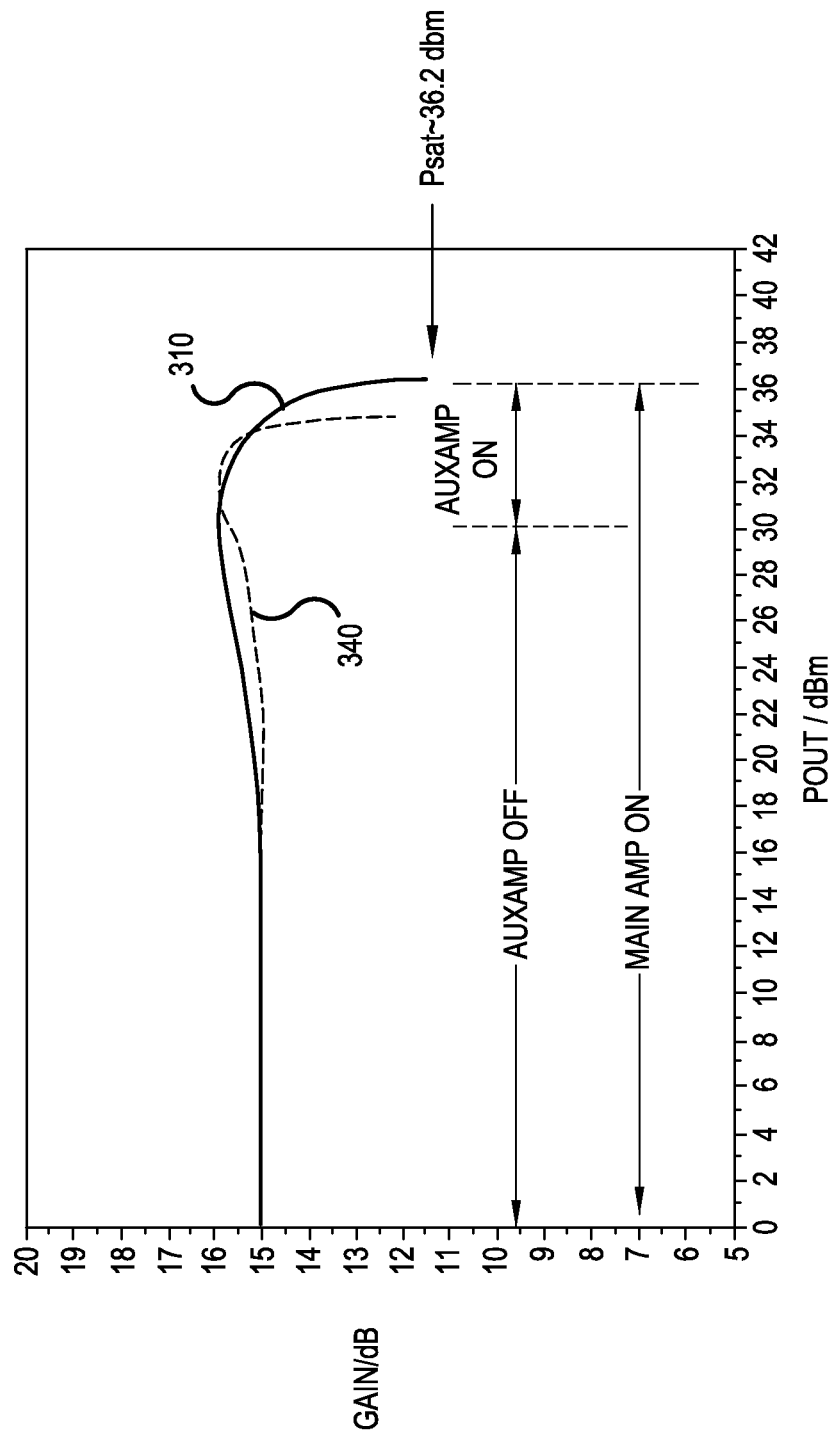
FIG. 3 is a graph.

FIG. 3 is a graph showing typical measured output power characteristics of a Doherty amplifier, such as the Doherty amplifier 200, when a standard bias circuit is used as the second bias circuit 225 to bias the auxiliary transistor 220. The maximum power available from a combined main amplifier and auxiliary amplifier (main transistor 210 and auxiliary transistor 220 ON) in a non-Doherty configuration in this example is about 36.2 dBm, as shown by solid curve 310. However, the configuration of the Doherty amplifier 200 with the same combined size devices for the main transistor 210 and the auxiliary transistor 220 results in more than a 1 dB drop (to about 34.9 dBm) in saturated power, as indicated by dashed curve 340. The reason for this drop in saturated power is that the second bias circuit 225 shown in FIG. 2 does not source enough current to bias the auxiliary transistor 220 when it needs the current at high input power.

FIG. 4 is a block diagram illustrating an amplifier control circuit, according to a representative embodiment.

Referring to FIG. 4, a bias circuit 400 is configured to apply a bias current to a low quiescent current amplifier, indicated by transistor 440. A low quiescent current amplifier operates in at least one of a Class-B mode or Class-C mode, as would be apparent to one of ordinary skill in the art. An example of an electronic device having a low quiescent current amplifier that would benefit from implementation of the bias circuit 400 is the Doherty amplifier 200, discussed above with reference to FIG. 1, in which the auxiliary amplifier, including the auxiliary transistor 120, is a low quiescent current amplifier.

The bias circuit 400 includes a first transistor 410, a second transistor 420 and a transistor pair circuit 430. The transistor pair circuit 430 includes a third transistor 433 and a fourth transistor 434 connected in series between the first transistor 410 and ground. The fourth transistor 434 is also connected in parallel with a dividing resistance 435, although the third transistor 433 may alternatively be connected in parallel with the dividing resistance 435. The dividing resistance 435 is configured to divide an output current from the third transistor 433 between the dividing resistance 435 and the fourth transistor 434, preventing the fourth transistor 434 from being fully activated, thereby creating low voltage drop. The low voltage drop enables biasing of the transistor 440 in the low quiescent current amplifier into one of the Class-B mode or the Class-C mode, for example.

The bias circuit 400 further includes a first resistance 415 connected between the first transistor 410 and an auxiliary bias voltage source (Vaux), and a second resistance 425 connected between the second transistor 420 and the low quiescent current amplifier. The second resistance 425 may alternatively be split into two series-connected resistors, one of which is considered part of the bias circuit 400 and the other considered part of the low quiescent current amplifier.

More particularly, the first transistor 410 has a first base connected via the first resistance 415 to the auxiliary bias voltage source (Vaux), a first collector connected to a supply bias voltage source (Vbias), and a first emitter connected to a first node 411. Both the auxiliary bias voltage source (Vaux) and the supply bias voltage source (Vbias) may be external power supplies, and are configured to provide auxiliary bias voltage and supply bias voltage, respectively. The first transistor 410 and the first resistance 415 are thus configured to act as a current source. The transistor pair circuit 430 acts as a voltage source.

The second transistor 420 has a second base connected to the first emitter of the first transistor 410 at the first node 411, a second collector connected to the supply bias voltage source (Vbias) (as well as the to the first collector of the first transistor 410), and a second emitter connected via the second resistance 425 to a base of the transistor 440 in the low quiescent current amplifier. The capacitor 422 is connected between the second base of the second transistor 420 and ground. The second transistor 420, the second resistance 425 and the capacitor 422 are thus configured to buffer current supplied to the base of the transistor 440.

The transistor pair circuit 430 is connected in series between ground and the second base of the second transistor 420 at the first node 411. As mentioned above, the transistor pair circuit 430 includes the third transistor 433 and the fourth transistor 434. The third transistor 433 has a third base and a third collector each connected to the first emitter of the first transistor 410 at the first node 411. The third transistor 433 also has a third emitter connected to a second node 412. The fourth transistor 434 has a fourth base and a fourth collector each connected to the third emitter of the third transistor 433 at the second node 412. The fourth transistor 434 also has a fourth emitter connected to ground. Generally, operation of the third transistor 433 is controlled by the output of the first transistor 410, and operation of the fourth transistor 434 is controlled by an output of the third transistor 433.

In the depicted embodiment, the dividing resistance 435 (which may also be referred to as the third resistance) is connected between the fourth collector and the fourth emitter of the fourth transistor 434, such that the dividing resistance 435 and fourth transistor 434 are connected in parallel with one another. The transistor pair circuit 430 is thus configured to act as a voltage source. In an alternative configuration, the dividing resistance 435 may be connected in parallel with the third transistor 433, as opposed to the fourth transistor 434, without departing from the scope of the present teachings.

As stated above, the bias circuit 400 provides bias current to a low quiescent current amplifier, enabling any transistor (e.g., transistor 440) to be biased to a very low quiescent current level. More particularly, the second resistance 425 is connected to the base of the transistor 440, which is also connected to the input port 444 (RF IN), for controlling operation of the low quiescent current amplifier. This connection is also the output of the bias circuit 400. The transistor 440 further includes an emitter connected to ground and a collector connected to the output port 445 (RF OUT), The collector of the transistor 440 is also connected to a supply voltage source (Vcc) via a DC feed 447. Alternatively, the DC feed 447 may be replaced by an inductor.

The low quiescent current amplifier (with the transistor 440) may be incorporated as the auxiliary amplifier (with the auxiliary transistor 220) in a Doherty amplifier, such as the illustrative Doherty amplifier 200 shown in FIG. 2. In this case, the bias circuit 400 would be implemented in place of the second bias circuit 225 of the Doherty amplifier 200. However, it is understood that the bias circuit 400 may be used to stably bias any amplifier requiring a low quiescent current, without departing from the scope of the present teachings.

FIG. 5 is a block diagram illustrating an amplifier control circuit, according to a representative embodiment.

Referring to FIG. 5, a bias circuit 500 is configured to apply a bias current to a low quiescent current amplifier, indicated by transistor 440, e.g., operating in at least one of a Class-B mode or Class-C mode. An example of an electronic device having a low quiescent current amplifier that would benefit from implementation of the bias circuit 500 is the Doherty amplifier 200, discussed above with reference to FIG. 2.

The bias circuit 500 includes a current mirror 510 (in place of the first transistor 410 shown in FIG. 4) to act as a current source. The bias circuit 500 further includes a second transistor 520 and the transistor pair circuit 430, which is substantially the same as discussed above with reference to FIG. 4. That is, the transistor pair circuit 430 includes the third transistor 433 and the fourth transistor 434 connected in series between the current mirror 510 and ground. One of the third transistor 433 and the fourth transistor 434 is also connected in parallel with a dividing resistance 435. The bias circuit 500 further includes a first resistance 515 connected between the current mirror 510 and an auxiliary bias voltage source (Vaux), and a second resistance 525 connected between the second transistor 520 and the low quiescent current amplifier.

More particularly, the current mirror 510 includes multiple transistors, shown as a first mirror transistor 511 and a second mirror transistor 512, connected to the auxiliary bias voltage source (Vaux) via the first resistance 515 and to the supply bias voltage source (Vbias) via an emitter resistance 518. In the depicted embodiment, the first mirror transistor 511 of the current mirror 510 has a first mirror base and a first mirror collector, each of which is connected to the auxiliary bias voltage source (Vaux) via the first resistance 515, and a first mirror emitter connected to the supply bias voltage source (Vbias).

The second mirror transistor 512 has a second mirror base connected to the first mirror base of the first mirror transistor 511 and to the auxiliary bias voltage source (Vaux) via the first resistance 515. The second mirror transistor 512 further includes a second mirror collector connected to a first node 411, and second mirror emitter connected to the supply bias voltage source (Vbias) via the emitter resistance 518. Notably, the emitter resistance 518 is optional; it provides flexibility for the bias current to the second mirror transistor 512. Also, the value of the first resistance 515 and the ratio of the size of the first mirror transistor 511 to the size of the second mirror transistor 512 determine the current through the second mirror transistor 512 and the voltage at the base of the second transistor 520. The current mirror 510 and the first resistance 515 are thus configured to act as a current source, and the transistor pair circuit 430 acts as a voltage source.

The second transistor 520 has a second base connected to the current mirror 510 at the first node 411, a second collector connected to the supply bias voltage source (Vbias) and a second emitter connected via the second resistance 525 to a base of the transistor 440 in the low quiescent current amplifier. Both the auxiliary bias voltage source (Vaux) and the supply bias voltage source (Vbias) may be external power supplies, and are configured to provide auxiliary bias voltage and supply bias voltage, respectively. The capacitor 522 is connected between the second base of the second transistor 520 and ground. The second transistor 520, the second resistance 525 and the capacitor 522 are thus configured to buffer current supplied to the base of the transistor 440.

As discussed above, the transistor pair circuit 430 is connected in series between ground and the second base of the second transistor 520 at the first node 411. The transistor pair circuit 430 includes the third transistor 433 and the fourth transistor 434, as well as the dividing resistance 435 connected in parallel with one of the third transistor 433 and the fourth transistor 434. The additional details of the transistor pair circuit 430 are described above, and will not be repeated herein.

The bias circuit 500 provides bias current to the low quiescent current amplifier, enabling a transistor (e.g., transistor 440) to be biased to a very low quiescent current level. More particularly, the second resistance 525 is connected to the base of the transistor 440, which is also connected to the input port 444, for controlling operation of the low quiescent current amplifier. This connection is also the output of the bias circuit 500. The low quiescent current amplifier (with the transistor 440) may be incorporated as the auxiliary amplifier (with the auxiliary transistor 120) in a Doherty amplifier, such as the illustrative Doherty amplifier 200 shown in FIG. 2. In this case, the bias circuit 500 would be implemented in place of the second bias circuit 225 of the Doherty amplifier 200. However, it is understood that the bias circuit 500 may be used to stably bias any amplifier requiring a low quiescent current, without departing from the scope of the present teachings.

Although the transistors in the foregoing description and depicted in FIGS. 1, 2, 4 and 5 are BJTs, it is understood that various embodiments are not limited to BJTs. For example, one or more of the transistors may be a field effect transistor (FET), such as a gallium arsenide FET (GaAs FET), GaAs heterojunction bipolar transistor (HBT), a metal-oxide semiconductor FET (MOSFET) or a heterostructure FET (HFET), a high electron mobility transistor (HEMT), a pseudomorphic HEMT (pHEMT), or the like, without departing from the scope of the present teachings. Likewise, for purposes of discussion, terms typically corresponding to BJTs, such as emitter, collector and base, are used herein to describe the transistors. However, it is understood that these terms are not intended to be limiting, and that terms corresponding to FETs, such as drain, source and gate, would be applicable for other types of transistors in various alternative configurations.

An additional benefit of the bias circuits, according to the various embodiments (e.g., shown in FIGS. 4 and 5), is that the low quiescent current amplifier, indicated by transistor 440, may be used to control the bias current Ica (quiescent) across six orders of magnitude up to a very high level. In contrast, the conventional bias circuit (e.g., shown in FIG. 1) can only manage about two orders of magnitude. This is because the current source (e.g., the first transistor 410 in FIG. 4 and the current mirror 510 in FIG. 5) is used to control the bias current to the bias-voltage defining network of the transistor pair circuit 430.

Figure 6A:
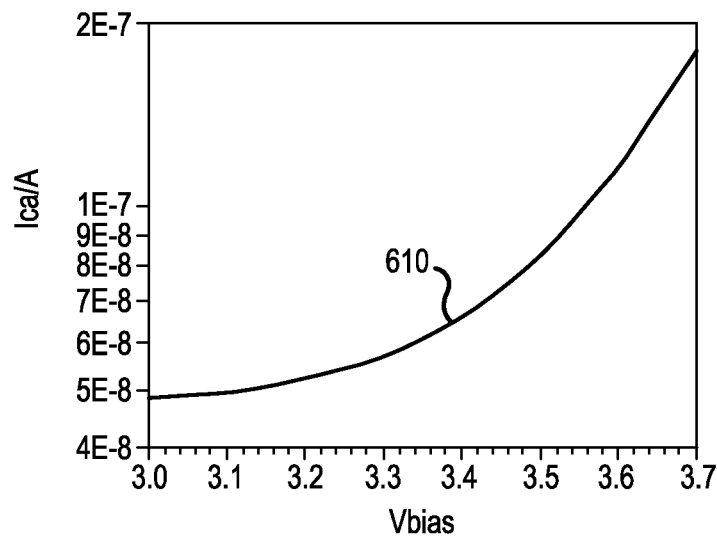
FIGS. 6A and 6B are comparative graphs illustrating current Ica as a function of auxiliary bias voltage source, using a conventional bias circuit and a bias circuit according to a representative embodiment.
Figure 6B:
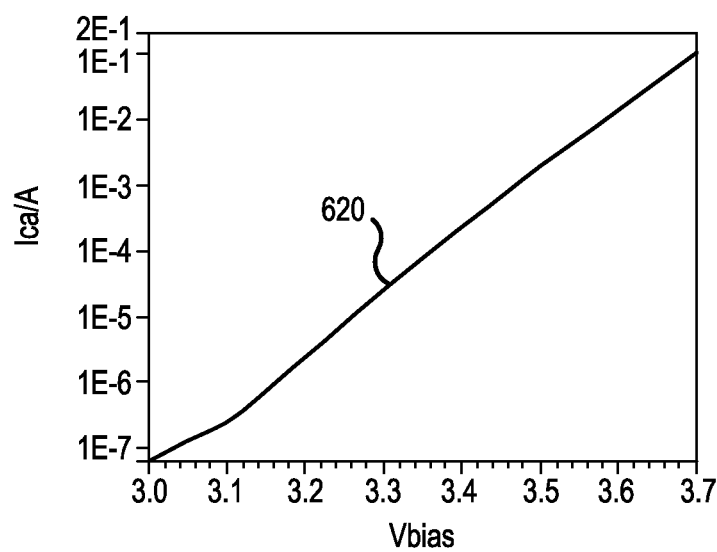

For example, FIGS. 6A and 6B are graphs illustrating current Ica as a function of the supply bias voltage source (Vbias), where the vertical scale is in amperes and the horizontal scale is in volts. As shown by curve 610 in FIG. 6A, determined using a conventional bias circuit (e.g., FIG. 1), as the supply bias voltage source (Vbias) increases from 3.0 volts to 3.7 volts, the current Ica increases from about $4.8 \times 10^{-8}$ to about $1.8 \times 10^{-7}$ amp. However, as shown by curve 620 in FIG. 6B, determined using a bias circuit according to a representative embodiment (e.g., FIG. 4), as the supply bias voltage source (Vbias) increases from 3.0 volts to 3.7 volts, the current Ica increases from about $4.8 \times 10^{-8}$ to about $1.0 \times 10^{-1}$ amp.

Figure 1:
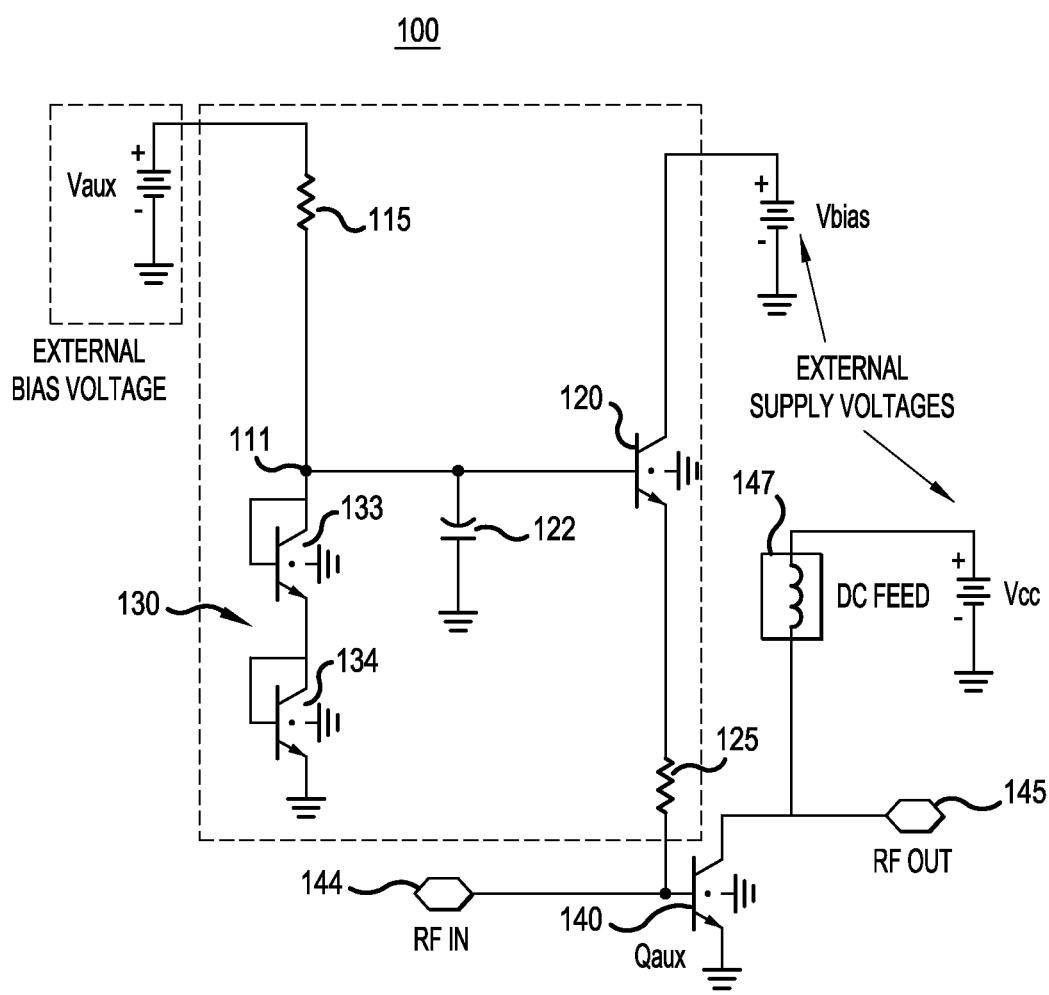
FIG. 1 is a circuit diagram illustrating a conventional bias circuit for biasing a low quiescent current amplifier.
Figure 7A:
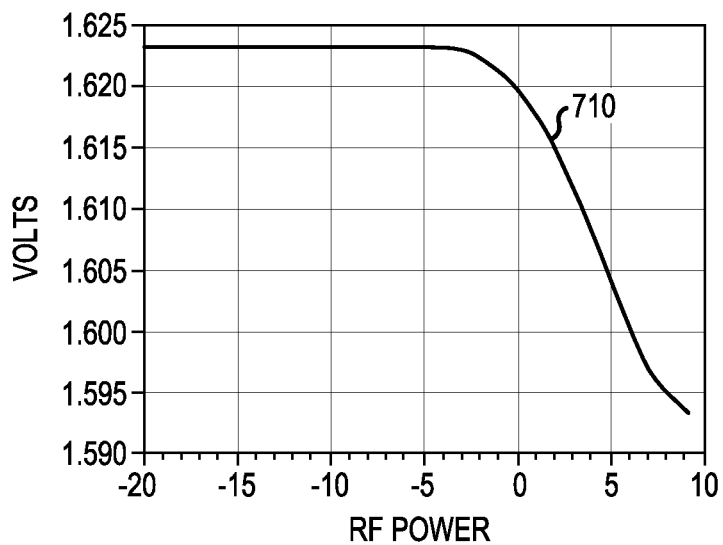
FIGS. 7A and 7B are comparative graphs illustrating simulated results of bias voltages at the base of the low quiescent current amplifier, using a conventional bias circuit and a bias circuit according to a representative embodiment.
Figure 7B:
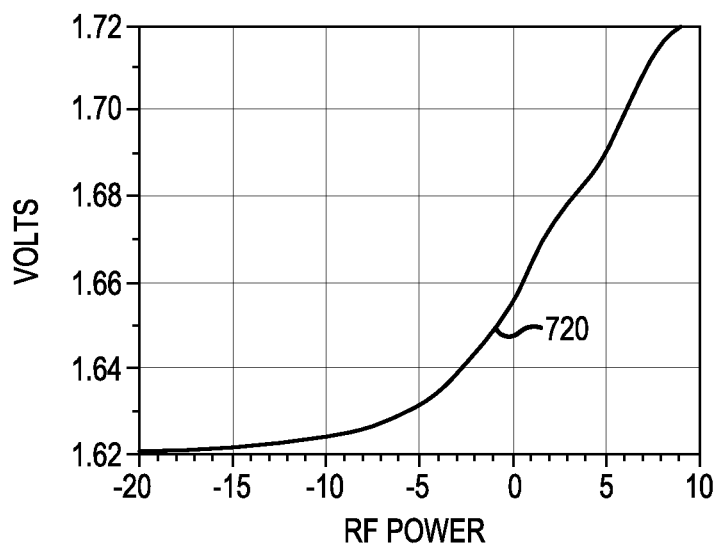

FIGS. 7A and 7B are graphs illustrating simulated results of bias voltages at the base of the low quiescent current amplifier, e.g., indicated by the auxiliary transistor 220, of the Doherty amplifier 200 in FIG. 2, where the vertical scale is in volts and the horizontal scale is RF power in dBm. As shown by curve 710 in FIG. 7A, determined using a conventional bias circuit (e.g., FIG. 1), the base voltage of the auxiliary transistor 220 drops as RF power is increased to high levels, since the voltage drop across the first resistance 115 of the bias circuit 100 in FIG. 1 is also increased. However, as shown by curve 720 in FIG. 7B, determined using a bias circuit according to a representative embodiment (e.g., FIG. 4), the base voltage of the auxiliary transistor 220 continues to rise as the RF power is increased to high levels, to support increases in the base current demanded by the auxiliary transistor 220.

Figure 8:
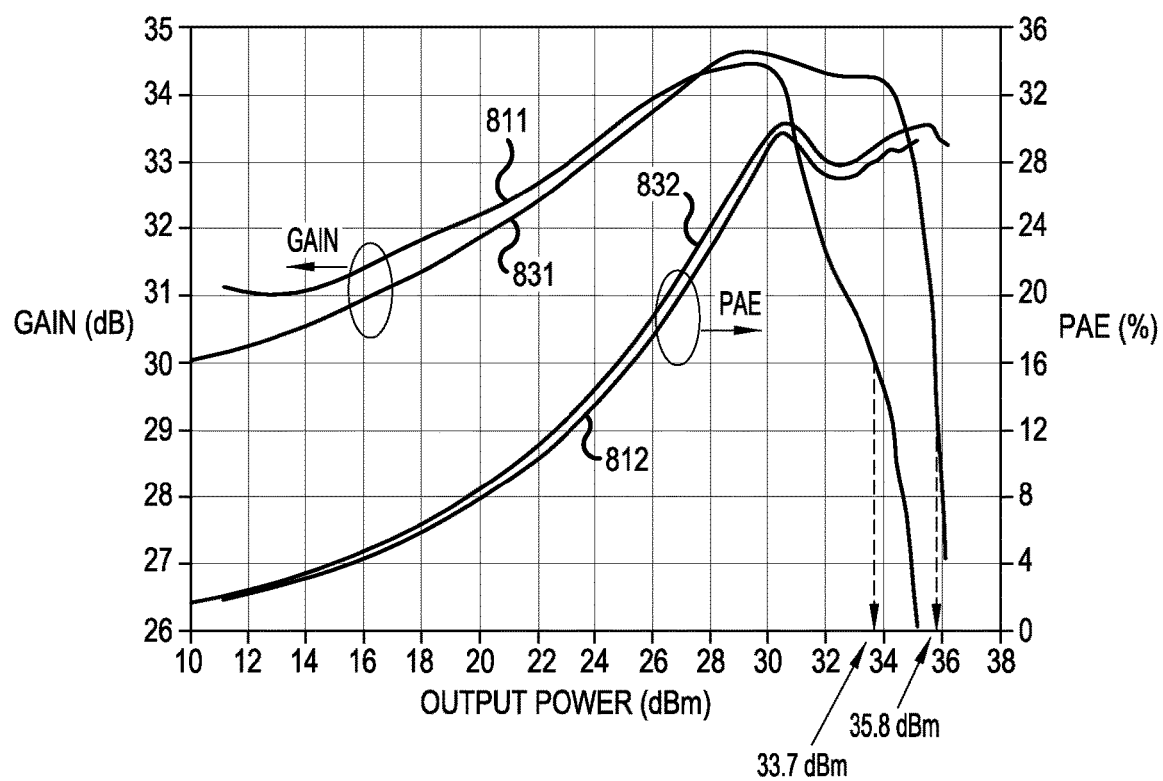
FIG. 8 is a graph illustrating actual measurements of a Doherty amplifier, comparing gain and efficiency, using a conventional bias circuit and a bias circuit according to a representative embodiment.

FIG. 8 is a graph illustrating actual measurements of a Doherty amplifier, similar to the Doherty amplifier 200 shown in FIG. 2, implemented with GaAs HBTs. The vertical scale is gain in dB and the horizontal scale is output power in dBm. Referring to FIG. 8, curve 811 indicates gain using a conventional bias circuit, curve 812 indicates efficiency using a conventional bias circuit, curve 831 indicates gain using a bias circuit according to a representative embodiment, and curve 832 indicates efficiency using a bias circuit according to a representative embodiment.

Comparison of curves 811 and 831 shows that saturated power of the Doherty amplifier is about 2 dB higher using the bias circuit according to the representative embodiment (about 35.8 dBm as compared to about 33.7 dBm). Meanwhile, curves 812 and 832 show that gain is sustained up until higher output power (e.g., above about 30.8 dBm). Also, comparison of curves 812 and 832 shows that power added efficiency (PAE) is improved across all output power levels. Because the gain curve 831 is smoother (in the sense that there are less inflection points), it is also inherently more linear and easier to implement in a linearization loop around the depicted Doherty amplifier.

It is understood that the values of various components of the bias circuits, according to the representative embodiments (e.g., bias circuits 400 and 500), including the resistance and capacitance values, may vary to provide unique benefits for any particular situation or to meet application specific design requirements of various implementations, as would be apparent to one skilled in the art. It is further understood that the types of transistors may vary, as discussed above, and that the collectors/emitters (or the sources/drains) of the various transistors may be reversed, without affecting the relevant functionality, depending on design factors of various embodiments.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A bias circuit for applying a bias current to a low quiescent current amplifier, the bias circuit comprising:
    a first transistor connected to a supply bias voltage source (Vbias) and an auxiliary bias voltage source (Vaux), operation of the first transistor being controlled by an auxiliary bias voltage output from the auxiliary bias voltage source (Vaux), wherein the first transistor acts as a current source;
    a second transistor connected to the supply bias voltage source (Vbias) and an output of the first transistor, operation of the second transistor being controlled by the output of the first transistor to selectively buffer an amount of supply bias current from the supply bias voltage source (Vbias) provided to the low quiescent current amplifier via a bias resistor, enabling stable biasing of the low quiescent current amplifier in at least one of a Class-B mode or a Class-C mode; and
    a transistor pair circuit comprising a third transistor and a fourth transistor connected in series between the first transistor and ground, one of the third transistor and the fourth transistor also being connected in parallel with a dividing resistor, wherein the transistor pair circuit acts as a voltage source.

2. The bias circuit of claim 1, wherein the dividing resistor is configured to divide an output current from the third transistor between the dividing resistor and the fourth transistor, preventing the fourth transistor from being fully activated, thereby creating low voltage drop.

3. The bias circuit of claim 2, wherein the low voltage drop enables biasing of the low quiescent current amplifier into one of Class-B mode or Class-C mode.

4. The bias circuit of claim 1, wherein operation of the third transistor is controlled by the output of the first transistor, and operation of the fourth transistor is controlled by an output of the third transistor.

5. A bias circuit for applying a bias current to a low quiescent current amplifier, the bias circuit comprising:
    a first transistor having a first base connected via a first resistance to an auxiliary bias voltage source (Vaux), a first collector connected to a supply bias voltage source (Vbias), and a first emitter;
    a second transistor having a second base connected to the first emitter of the first transistor, a second collector connected to the supply bias voltage source (Vbias), and a second emitter connected via a second resistance to a base of a transistor in the low quiescent current amplifier operating in at least one of a Class-B mode or Class-C mode; and
    a transistor pair circuit connected in series between the second base of the second transistor and ground, the transistor pair circuit comprising:
        a third transistor having a third base and a third collector each connected to the first emitter of the first transistor, and a third emitter; and
        a fourth transistor having a fourth base and a fourth collector each connected to the third emitter of the third transistor, and a fourth emitter connected to ground; and
        a third resistance connected between the fourth collector and the fourth emitter of the fourth transistor.

6. The bias circuit of claim 5, further comprising:
    a capacitor connected between the base of the second transistor and ground.

7. The bias circuit of claim 6, wherein the second transistor, the second resistance and the capacitor are configured to buffer current supplied to the base of the transistor in the low quiescent current amplifier.

8. The bias circuit of claim 5, wherein the transistor in the low quiescent current amplifier includes a collector connected to an amplifier output, and an emitter connected to ground.

9. A bias circuit for applying a bias current to for a low quiescent current amplifier, operating in at least one of a Class-B mode or Class-C mode, the bias circuit comprising:
    a current mirror, comprising a plurality of mirror transistors, connected to an auxiliary bias voltage source (Vaux) via a first resistance and to a supply bias voltage source (Vbias) via an emitter resistance;
    a second transistor having a second base connected to the current mirror, a second collector connected to the supply bias voltage source (Vbias) and a second emitter connected via a second resistance to a base of a transistor in the low quiescent current amplifier; and
    a transistor pair circuit connected in series between the current mirror and ground, the transistor pair circuit comprising:
        a third transistor having a third base and a third collector each connected to the current mirror, and a third emitter; and
        a fourth transistor having a fourth base and a fourth collector each connected to the third emitter of the third transistor, and a fourth emitter connected to ground; and
        a third resistance connected between the fourth collector and the fourth emitter of the fourth transistor.

10. The bias circuit of claim 9, wherein a first mirror transistor of the current mirror has a first mirror base and a first mirror collector each connected to the auxiliary bias voltage source (Vaux) via the first resistance, and a first mirror emitter connected to the supply bias voltage source (Vbias), and
    wherein a second mirror transistor of the current mirror has second mirror base connected to the first mirror base of the first mirror transistor and to the auxiliary bias voltage source (Vaux) via the first resistance, a second mirror collector connected to the second mirror base of the second transistor and a second mirror emitter connected to the supply bias voltage source (Vbias) via the emitter resistance.

11. The bias circuit of claim 10, wherein the third base and the third collector of the third transistor are each connected to the second mirror collector of the second mirror transistor.

12. The bias circuit of claim 9, further comprising:
    a capacitor connected between the base of the second transistor and ground.

13. The bias circuit of claim 12, wherein the second transistor, the second resistance and the capacitor are configured to buffer current supplied to the base of the transistor in the low quiescent current amplifier.

14. The bias circuit of claim 9, wherein the transistor in the low quiescent current amplifier includes a collector connected to an amplifier output, and an emitter connected to ground.

15. A bias circuit for applying a bias current to an auxiliary amplifier of a Doherty amplifier, the Doherty amplifier having a main amplifier and the auxiliary amplifier connected in parallel at an output of the Doherty amplifier, such that the auxiliary amplifier turns ON when the main amplifier has saturated, the bias circuit comprising:

a first transistor having a first base connected via a first resistance to an auxiliary bias voltage source (Vaux), a first collector connected to a supply bias voltage source (Vbias) and a first emitter;

a second transistor having a second base connected to the first emitter of the first transistor, a second collector connected to the supply bias voltage source (Vbias) and a second emitter connected via a second resistance to a base of a transistor in the auxiliary amplifier for providing a low quiescent current to the auxiliary amplifier, increasing efficiency of the Doherty amplifier; and a transistor pair circuit connected in series between the second base of the second transistor and ground, the transistor pair circuit comprising:

a third transistor having a third base and a third collector each connected to the emitter of the first transistor, and a third emitter; and a fourth transistor having a fourth base and a fourth collector each connected to the third emitter of the third transistor, and a fourth emitter connected to ground; and a third resistance connected in parallel with the fourth transistor, between the fourth collector and the fourth emitter of the fourth transistor.

16. The bias circuit of claim 15, wherein the auxiliary amplifier is biased in one of Class-B mode or Class-C mode by the low quiescent current provided to the base of the transistor in the auxiliary amplifier.

17. The bias circuit of claim 16, wherein the main amplifier is biased in one of Class-A mode or Class-AB mode by a quiescent current of a first bias circuit.

18. The bias circuit of claim 15, further comprising:
   a capacitor connected between the base of the second transistor and ground.

19. The bias circuit of claim 15, wherein quiescent current values are less than about 500 uA for current flowing in the auxiliary amplifier.

20. The bias circuit of claim 19, wherein quiescent current values are about 10 mA to about 100 mA for current flowing in the main amplifier.

* * * * *